United States Patent [19]
Acocella et al.

[11] Patent Number: 6,008,112
[45] Date of Patent: *Dec. 28, 1999

[54] METHOD FOR PLANARIZED SELF-ALIGNED FLOATING GATE TO ISOLATION

[75] Inventors: Joyce Molinelli Acocella, Hopewell Junction, N.Y.; Randy William Mann, Jericho, Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/004,571

[22] Filed: Jan. 8, 1998

[51] Int. Cl.$^6$ ............................................. H01L 21/8247
[52] U.S. Cl. ........................................... 438/593; 438/692
[58] Field of Search .................................. 438/593, 257, 438/594, 297, 692

[56] References Cited

U.S. PATENT DOCUMENTS

| | | |
|---|---|---|
| 4,997,781 | 3/1991 | Tigelaar . |
| 5,008,722 | 4/1991 | Esquivel . |
| 5,091,326 | 2/1992 | Haskell . |
| 5,143,860 | 9/1992 | Mitchell et al. . |
| 5,173,436 | 12/1992 | Gill et al. . |
| 5,177,028 | 1/1993 | Manning . |
| 5,411,905 | 5/1995 | Acovic et al. . |
| 5,424,569 | 6/1995 | Prall . |
| 5,559,048 | 9/1996 | Inoue . |
| 5,622,881 | 4/1997 | Acocella et al. . |
| 5,767,005 | 6/1998 | Doan et al. ............................ 438/593 |

*Primary Examiner*—Richard Booth
*Attorney, Agent, or Firm*—Schmeiser, Olsen & Watts; Eugene I. Shkurko

[57] ABSTRACT

A method for forming floating gate regions in non-volatile memory cells each having a floating gate and a control gate is disclosed. First, a plurality of isolation structures in a substrate extending above and below a surface of the substrate is formed. Second, a floating gate layer on the substrate over and between at least a portion of the isolation structures is formed. Finally, the floating gate layer is planarized down to the isolation structures for forming a plurality of the floating gate regions isolated by the isolation structures.

20 Claims, 2 Drawing Sheets

METHOD FOR PLANARIZED SELF-ALIGNED FLOATING GATE TO ISOLATION

BACKGROUND OF THE INVENTION

1. Technical Field

The invention relates generally to memory cells, and more specifically, to semiconductor non-volatile memory devices.

2. Background Art

In non-volatile memory devices, the placements of the floating polysilicon (floating gate) and control gate of a cell are critical for the proper operability of a non-volatile storage transistor device. That is, the floating gate is required to overlap an isolation structure of the cell, and the control gate must align with the floating gate to ensure the proper formation of the device.

As feature sizes are reduced to sub-micrometer dimensions to achieve higher packing densities of devices, several problems emerge. First, large steps in the control gate can cause processing problems. Typically, the control gate polysilicon is depositing on a non-planar area, and thus will go up and over the floating gate, creating a large step for the control gate. Hence, during subsequent processing, the step in the control gate may become sufficiently steep to either allow the formation of a spacer or cause breaks in the silicide, ultimately degrading the memory cell.

Second, the depth of focus of the lithography stepper becomes smaller. Thus, the different heights of different features generate a depth of field problem.

Finally, a problem known as the "bird's beak" problem occurs where the isolation structure tapers to the substrate in the source and drain regions. Such a taper results in an electrical width smaller than the mask dimensions.

It is evident that the profusion of different heights during processing and the several alignment steps prevent efficient use of advanced lithography processes and other processes to generate high packing densities of devices on a substrate, since the depth of field reduces with the smaller dimensions that are needed for scaling.

Solutions to some of these problems are found in the following U.S. Patents: U.S. Pat. No. 5,559,048, "Method of Making a Double Layered Floating Gate EPROM With Trench Isolation", issued September 1996 to Inoue; U.S. Pat. No. 5,173,436, "Method of Manufacturing an EEPROM With Trench-Isolated Bitlines", issued December 1992 to Gill et al.; and U.S. Pat. No. 5,091,326, "EPROM Element Employing Self-Aligning Process", issued February 1992 to Haskell. These patents disclose self-alignment methods to eliminate some of the problems with the floating gate alignment.

Although the aforementioned patents use self-alignment techniques, some of the techniques have complex processing, and cell size still may not be reduced. Furthermore, in some cases, the control gate still develops a step, affecting the quality of the cell.

SUMMARY OF THE INVENTION

It is thus an advantage of the present invention to provide a method for planarizing and self-aligning the floating gate to the isolation through which the cell size is reduced.

It is a further advantage of the present invention to provide a method for self-aligning the control gate to the floating gate without creating a step in the control gate.

The advantages of the invention are realized by a method for forming floating gate regions in non-volatile memory cells each having a floating gate and a control gate. First, a plurality of isolation structures in a substrate extending above and below a surface of the substrate is formed. A nitride layer thickness determines the extension of the isolation structures above the surface of the single crystal silicon. Second, a floating gate layer on the substrate over and between at least a portion of the isolation structures is formed. Finally, the floating gate layer is planarized down to the isolation structures for forming a plurality of the floating gate regions isolated by the isolation structures. The planarization of the floating gate layer to the isolation structures also allows a planar control gate.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
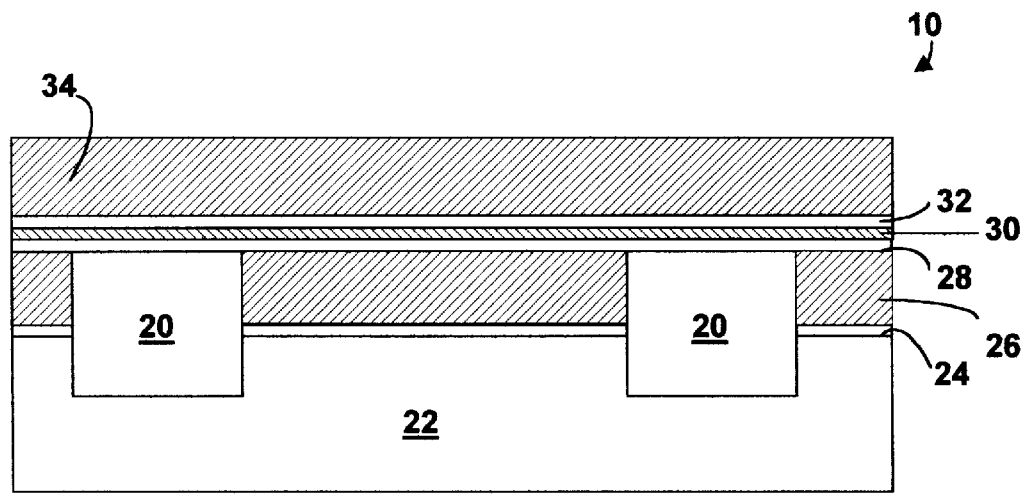
FIG. 1 is a simplified diagram of a memory cell in accordance with a preferred embodiment of the present invention.

Referring to FIG. 1, there is shown, in highly simplified form, a non-volatile memory cell 10 in accordance with the present invention. In this structure, isolation structures 20, (e.g., shallow trench isolation or STI), are formed using an isolation material, such as oxide. The oxide is recessed (recessed oxide or ROX), because a portion of the oxide 20 is recessed into the substrate 22. Regions between the isolation structures 20 are covered by a thin tunnelling oxide film 24. The floating gates 26, which are preferably formed of polysilicon, extend from the tunnelling oxide film 24 and, in accordance with the invention, is planarized with the isolation structures 20. This planarization may be done by a chemical/mechanical polishing operation, but is not limited to such. The planarization allows the inter-poly dielectric, preferably of an oxide-nitride-oxide (ONO) composition and construction 28, 30 and 32 respectively, and the control gate 34 to be formed on a planar surface without being compromised by surface topology. In this invention, problems of lithographic exposure focus are generally eliminated, and the memory cell is scalable to a smaller design (approximately 30%–40% smaller) than the conventional memory cells.

Figures 2, 3:
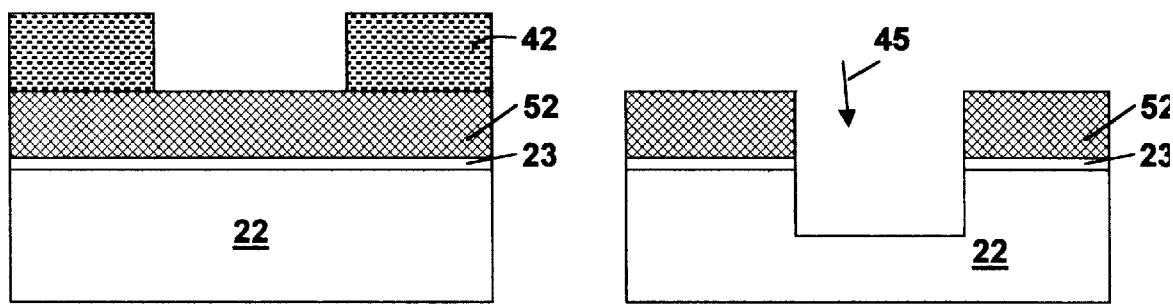
FIGS. 2, 3, 4, 5, 6 and 7 are cross-sectional views showing a fabrication sequence of FIG. 1 in accordance with a preferred embodiment of the present invention.

Referring now to FIGS. 2–7, fabrication of a preferred embodiment of the present invention will be discussed. As seen in FIG. 2, a pad oxide 23 of approximately 10–40 Angstroms thickness is grown over the silicon substrate 22. A nitride layer 52 is then deposited over the pad oxide 23. The nitride layer, as will be seen in subsequent figures, is important to the development of the isolation structures, mainly because the thickness of the nitride layer determines the extension of the isolation structures. An approximate thickness of the nitride layer may range between approximately 1000–2500 Angstroms. A resist 42 or masking material is then placed on the nitride, indicating where the isolation areas are to be located.

Figures 4, 5:
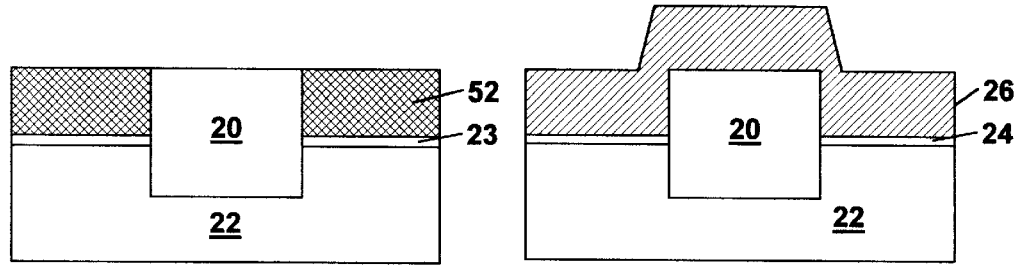

Referring now to FIG. 3, an isolation structure is created by etching 45 a trench through the nitride layer 52, the pad oxide 23 and into the substrate 22. While only one etching 45 is shown, it will be appreciated that a plurality of such trenches may be employed on a single semiconductor substrate, as shown in FIG. 1, each delineating a subsequent active area of a device. The trench is then filled with an isolation material, such as oxide and planarized to the nitride layer 52 to form an isolation structure 20, as shown in FIG. 4. As aforementioned, the thickness of the isolation structure 20 is dependent upon the thickness of the nitride layer 52 and the etched depth into the silicon. The hardness and resistance of the nitride layer 52 to a chemical/mechanical polishing process allows the planarization of the isolation structure to be self-limiting. Depositing the nitride layer first, then filling the shallow trench regions with deposited oxide and planarizing the isolation structure, as disclosed in this invention, eliminates the formation of a bird's beak and its associated problems as aforementioned. The nitride 52 and pad oxide 23 are then stripped by using industry standard techniques.

Figures 6, 7:
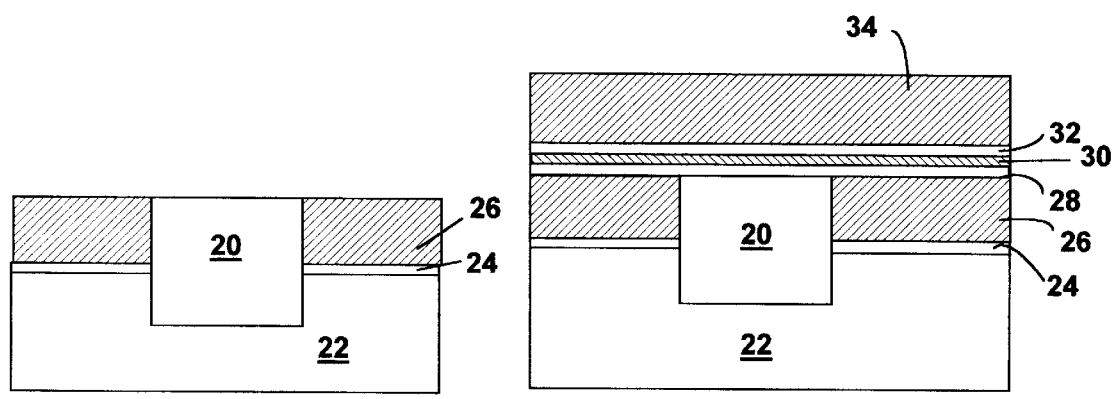

A thin tunneling oxide 24 is then grown as seen in FIG. 5, the tunneling oxide thickness ranging between approximately 50–150 Angstroms. Then, a first polysilicon layer 26 is deposited as a blanket layer over the appropriate areas. The thickness of the first polysilicon layer 26 ranges between approximately 300–1200 Angstroms thick. As seen in FIG. 6, the first polysilicon layer 26 is then planarized to the surface of the isolation structure 20, resulting in the floating gate structure and a planar surface. Thus, this planarization self-aligns the floating gate structure 26 with the isolation structures. The height of the protrusion of the isolation structures redefines the thickness thereof in accordance with the invention. One feature of the present invention includes using a patterned resist to selectively develop floating gate structures in the desired cells of the memory array. Thus, the floating gate structure does not have to extend across the entire array, as with many conventional techniques.

As seen in FIG. 7, an inter-poly dielectric, preferably of an oxide-nitride-oxide (ONO) composition 26, 30, 32, is then formed. The first oxide film 26 typically ranges between 50–150 Angstroms. The nitride film 30 is deposited at approximately 50–150 Angstroms. A patterned resist is then used to etch away the nitride film 30, oxide film 26 and floating gate regions 26 (with a Reactive Ion Etch or RIE) at the areas where conventional CMOS logic areas are to be formed (not shown). The tunnelling oxide 24 is also removed in the CMOS logic areas and a gate oxide 32 is then grown on the single crystal silicon in the CMOS regions. Preclean etch times, or additional dry etches, may be used to prevent excessively high isolation structures in logic areas and help the isolation structure erode in preparation for gate oxide 32 growth. The gate oxidation forms the final oxide layer 32 on the surface of the nitride, which is grown between 10–40 Angstroms thick. A second polysilicon layer 34 is then deposited to form both the control gate and the conventional CMOS gate. As aforementioned, the second polysilicon layer 34 will be planar over both the NVRAM array and CMOS regions. Conventional CMOS processing is then performed to form and enhance the operation of transistors around the gate structures, as is well-known in the art.

Thus, this invention provides a method to self-align the floating gate structures to the isolation structures and to form a control gate on a planar surface, reducing the overall cell size.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for forming floating gate regions in non-volatile memory cells, the method comprising the steps of:
    a) forming a plurality of isolation structures in a substrate extending above and below a surface of the substrate;
    b) selectively forming a floating gate layer on the substrate over and between at least a portion of the isolation structures using a patterned resist; and
    c) planarizing the selectively formed floating gate layer down to the isolation structures for forming a plurality of patterned floating gate regions isolated by the isolation structures.

2. The method of claim 1 further comprising, prior to step a), the step of: forming a nitride layer on the substrate having a preselected thickness, wherein the thickness determines a distance that the isolation structures extend above the surface of the substrate.

3. The method of claim 2 further comprising, subsequent to step a) but prior to step b), the step of removing said nitride layer.

4. The method of claim 2 wherein step a) further comprises the steps of:
    a1) forming a trench in the nitride layer and the substrate;
    a2) filling said trench with an isolation material; and
    a3) planarizing said isolation material to said nitride layer to form said isolation structures.

5. The method of claim 2 wherein said predetermined thickness is approximately within the range of 1000 to 2500 Angstroms.

6. The method of claim 1, further comprising, subsequent to step a) but prior to step b), the step of: forming a tunnelling oxide layer on the substrate between at least a portion of the isolation structures, whereon said floating gate layer is deposited.

7. The method of claim 1, wherein step c) is performed by a process including a chemical/mechanical polishing step.

8. The method of claim 1, further comprising the step of:
    d) forming an inter-poly dielectric layer on the floating gate layer and exposed regions of said isolation structures.

9. The method of claim 8, further comprising the step of:
    e) forming a control gate layer on the inter-poly dielectric layer, wherein said control gate layer is planar.

10. A method for forming floating gate regions in non-volatile memory cells, the method comprising the steps of:
    a) forming a nitride layer on a substrate having a preselected thickness;
    b) forming a plurality of isolation structures in a substrate extending below the surface of the substrate, and extending above the surface of the substrate a distance of said preselected thickness of said nitride layer;
    c) removing said nitride layer;
    d) using a patterned resist to selectively form a floating gate layer on the substrate over and between at least a portion of the isolation structures; and
    e) planarizing the selectively formed floating gate layer down to the isolation structures for forming a plurality of patterned floating gate regions isolated by the isolation structures.

11. The method of claim 10 wherein step b) further comprises the steps of:

b1) forming a trench in the nitride layer and the substrate;

b2) filling said trench with an isolation material; and b3) planarizing said isolation material to said nitride layer to form said isolation structures.

12. The method of claim 10, wherein said predetermined thickness is approximately in the range of 1000 to 2500 Angstroms.

13. The method of claim 10 further comprising, subsequent to step c) but prior to step d), the step of: forming a tunnelling oxide layer on the substrate between at least a portion of the isolation structures, whereon said floating gate layer is deposited.

14. The method of claim 10, wherein step e) is performed by a process including a chemical/mechanical polishing step.

15. The method of claim 10, further comprising the step of:

f) forming an inter-poly dielectric layer on the floating gate layer and exposed regions of said isolation structures.

16. The method of claim 15, further comprising the step of:

g) forming a control gate layer on the inter-poly dielectric layer, wherein said control gate layer is planar.

17. A method for forming a non-volatile memory cell, the method comprising the steps of:

a) forming a pad oxide layer on a substrate;

b) forming a nitride layer on the pad oxide layer, said nitride layer having a preselected thickness;

c) forming a plurality of isolation structures in a substrate extending below the surface of the substrate, and extending above the surface of the substrate a distance of said preselected thickness of said nitride layer;

d) removing said pad oxide layer and said nitride layer;

e) forming a tunneling oxide layer and a floating gate layer on the substrate over and between at least a portion of the isolation structures, wherein the floating rate layer is selectively formed over preselected cells by using a patterned resist;

f) planarizing the entire selectively formed floating gate layer down to the isolation structures for forming a plurality of patterned floating gate regions isolated by the isolation structures;

g) forming an inter-poly dielectric layer on the floating gate layer and exposed regions of said isolation structures;

h) forming a control gate layer on the inter-poly dielectric layer, wherein said control gate layer is planar; and i) completing said non-volatile memory cell.

18. The method of claim 17 wherein step c) further comprises the steps of:

c1) forming a trench in the nitride layer and the substrate;

c2) filling said trench with an isolation material; and c3) planarizing said isolation material to said nitride layer to form said isolation structures.

19. The method of claim 17, wherein said predetermined thickness is approximately within the range of 1000 to 2500 Angstroms.

20. The method of claim 17, wherein step f) is performed by a process including a chemical/mechanical polishing step.

\* \* \* \* \*